United States Patent [19]

Leuschner

[11] 3,968,443

[45] July 6, 1976

[54] SOLID STATE TELEVISION CHANNEL SELECTION SYSTEM

[75] Inventor: Horst Leuschner, Dallas, Tex.

[73] Assignee: Texas Instruments Incorporated, Dallas, Tex.

[22] Filed: Sept. 25, 1974

[21] Appl. No.: 508,968

[52] U.S. Cl.................................. 325/455; 325/464; 340/172.5
[51] Int. Cl.² ........................................... H04N 5/50
[58] Field of Search ......... 325/455, 459, 464, 465, 325/469, 453; 340/336, 172.5

[56] References Cited
UNITED STATES PATENTS

| | | | |
|---|---|---|---|
| 3,845,394 | 10/1974 | Hamada | 325/464 |
| 3,846,707 | 11/1974 | Sakamoto et al. | 325/453 |

Primary Examiner—George H. Libman
Attorney, Agent, or Firm—Harold Levine; James T. Comfort; James O. Dixon

[57] ABSTRACT

The specification discloses various embodiments of solid state television channel-number display systems for use with television channel selection systems. The systems provide channel-number dislay with selection systems providing sequential and/or parallel access of television channels by operation of simple pushbutton or sense touch switches on the control panel of the television set, as well as sequential or parallel access of the channels through operation of remote control units. The selected television channel-number may be displayed in the parallel access mode by illuminating the actuated parallel access switch, or by the utilization of seven segment numerical displays with either the sequential or parallel access modes. The system enables selected television channels to be skipped during the sequential access mode. The system enables the operator to selectively choose which VHF and UHF channels may be selected by the system with display of the channel-number of the selected channel.

8 Claims, 22 Drawing Figures

SOLID STATE TELEVISION CHANNEL SELECTION SYSTEM

This invention relates to television channel selection, and more particularly relates to a solid state system for selecting television channels and for displaying the selected channel.

It is well known that problems commonly occur in conventional rotary mechanical switch tuning systems which are presently utilized to select channels in television sets. For example, such mechanical rotary switches are subject to mechanical failure and inferior performance due to the inherent unreliability of the switch contacts. In addition, such rotary mechanical switches have not been able to provide parallel channel access, or the direct selection of a desired channel without the requirement of sequentially moving through unwanted channels. Moreover, such rotary mechanical switches have been bulky and expensive.

It has been heretofore proposed to eliminate the problems associated with rotary mechanical switches by the utilization of electronic circuitry. However, such previously developed electronic channel selection systems have not been sufficiently flexible to enable widespread use for a variety of different types of television sets and applications. For example, certain previously developed systems have required extremely uniform varactor tuning diodes to enable channel tuning, thereby allowing insufficient tolerances for conventional variances between varactor diodes. Other previously developed systems have not been sufficiently modular to enable a selection of various types of channel access or displays. Moreover, previously developed electronic channel selectors have not been sufficiently economical to fabricate and have required uneconomical printed circuit boards or other uneconomical fabrication techniques or construction. For example, certain prior systems have required expensive potentiometers for each channel desired to be tuned.

In addition, previously developed electronic television tuning systems have not satisfactorily satisfied recent regulatory requirements which call for a television tuner to provide a comparable capability and quality of tuning for both VHF and UHF stations. Specifically, such prior tuning systems have not enabled selection and display of a selected group of precise UHF channels, nor have the prior systems provided means for easily changing selected UHF channels.

In accordance with the present invention, a solid state system is provided for tuning a television set which includes an array of switches each corresponding to a predetermined television channel. An address generator is responsive to the operation of the switches for generating multibit digital address words each corresponding to one of the switches. A display is responsive to the digital address words for visually indicating which television channel is presently being selected. A tuning memory includes a random access memory for storing digital tuning words and for outputting the tuning words in response to the address words. Circuitry converts the tuning words into analog signals and controls a varactor diode tuner in order to select the desired television channel.

In accordance with another aspect of the invention, a television tuning system includes a matrix array of switches for selecting a desired television channel. An address generator generates a unique binary address corresponding to the selected channel. A tuning memory stores a plurality of digital tuning words and outputs one digital tuning word in response to each unique binary address. A digital-to-analog converter converts the binary tuning words into an analog signal for providing channel tuning. Circuitry is responsive to the unique binary address for generating one of three band selection signals. A diode tuner is responsive to the analog signal and the band selection signal for tuning the desired television channel automatically.

In accordance with yet another aspect of the invention, a sequential access television channel tuning system includes switches for generating up and down scan indications. An up/down counter is responsive to the switches for counting clock signals and for generating binary address signals. A memory generates unique digital tuning words in response to the address signals. Circuitry is responsive to the tuning words for tuning to a desired television channel.

In accordance with another aspect of the invention, a television channel tuning system includes a matrix array of switches operable to select a desired television channel. An address generator generates a unique binary address corresponding to the selected channel. A memory stores a plurality of digital tuning words each representative of a different television channel. A converter converts the tuning words into analog tuning levels. Circuitry is operable to selectively change the digital tuning words stored in the memory. Circuitry is also operable to cause selected ones of the digital addresses to be skipped during sequential access tuning of the system.

In accordance with yet another aspect of the invention, a combined sequential and parallel access television channel tuning system includes a matrix array of channel selection switches each operable to provide parallel selection of a television channel. Up and down channel selection switches are operable to provide sequential selection of television channels, the up and down switches being connected to terminals of the matrix array. Circuitry is responsive to operation of the matrix array switches for generating unique binary address signals corresponding to the selected television channel. Circuitry connected to the matrix array is responsive to operation of the up and down switches for generating sequential binary address signals corresponding to sequential television channels. Tuning circuitry is responsive to the binary address signals for tuning a selected television channel.

For a more complete understanding of the present invention and for further objects and advantages thereof, reference is now made to the following description taken in conjunction with the accompanying drawings, in which.

Figures 1, 2, 3, 4:
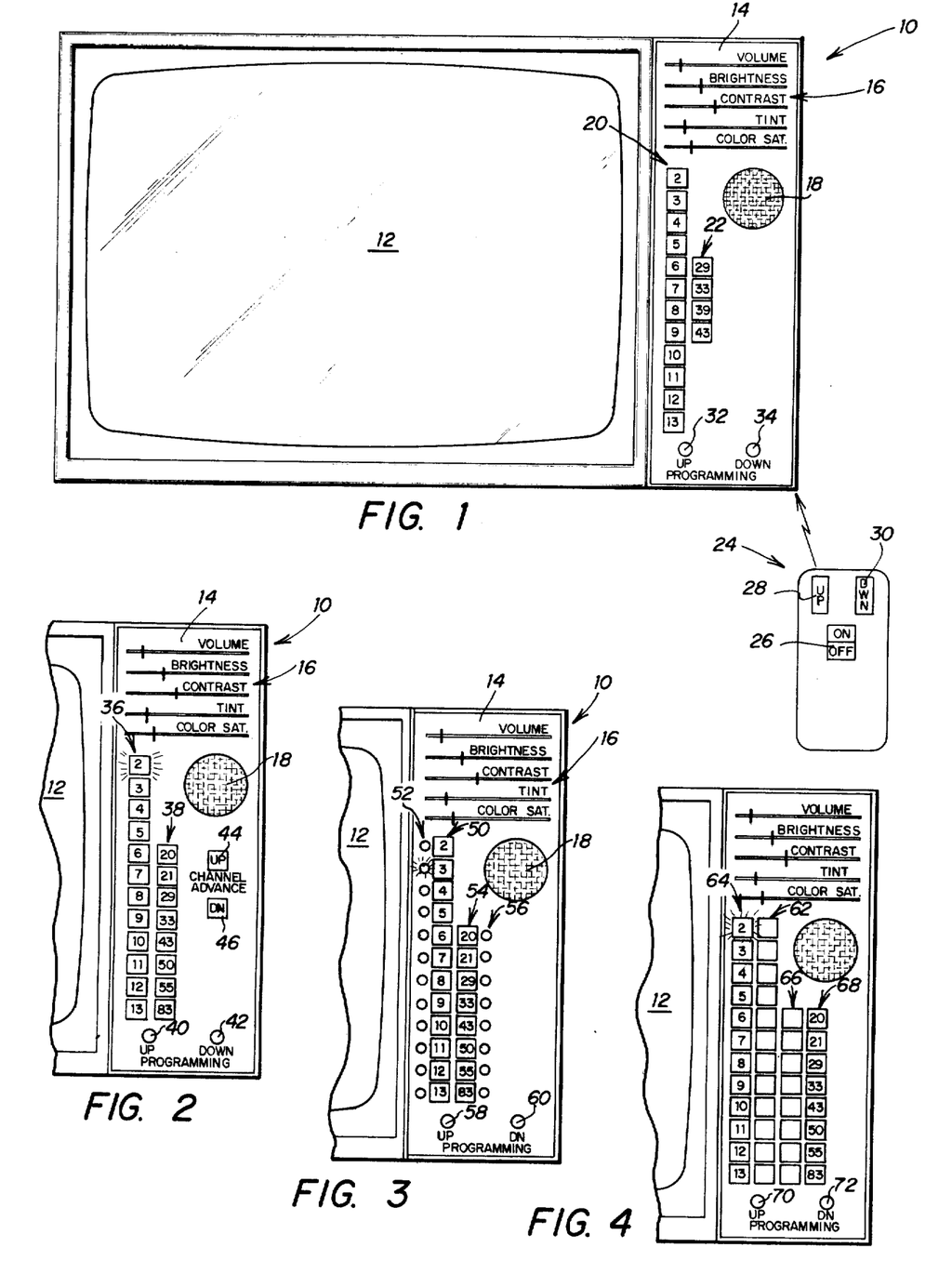
FIG. 1 is a somewhat diagrammatic view of a first embodiment of a 16 channel parallel access television selection system with illuminated sense buttons and including a sequential access remote tuning device.
FIG. 2 illustrates a 20 channel sequential access television channel selection system with illuminated channel lamps.
FIG. 3 illustrates a 20 channel parallel access channel selection system with pushbutton switches and adjacent light sources.
FIG. 4 illustrates another embodiment of a 20 channel parallel access selection unit with illuminated tab displays.

Referring to the drawings, FIGS. 1–6 illustrate variations of tuning control features for a television set which are provided by the present invention. Referring to FIG. 1, a television set 10 includes a conventional television screen 12 and a control panel 14. A picture and sound control set 16 includes variable controls for controlling the volume, picture brightness, contrast, tint and color of the television picture. A microphone 18 receives ultrasonic commands from the remote control unit.

A set of 12 pushbutton or touch sense switches 20 is provided to enable selection of VHF television stations. A set of four pushbuttons or touch sense switches 22 is provided to enable selection of UHF television channels. The switches 20 may be selectively depressed to select any one of VHF channels 2–13. The numerals 2–13 may be permanently affixed to the pushbutton switches 20, or alternatively, tabs bearing indicia may be selectively affixed to or removed from the switches 20. Depression of the switches 20 causes the selected switch and the corresponding indicia to become illuminated, such that the operator will know the desired channel has been selected for display.

The switches 22 may also be provided with removable tabs bearing numerals, such that any selected group of VHF and UHF television channels may be selected in the manner to be subsequently described. In the illustrated embodiment, four UHF television stations may be selected by depression of the switches 22. Depression of one of the switches 22 causes the selected switch and the corresponding tab indicia to be illuminated. Although in the illustrated embodiment four UHF channels are provided for selection, in other embodiments of the invention to be subsequently described, the capacity for more or less UHF channel selections may be provided. As will be subsequently described, when the television set 10 is initially tuned, the desired VHF and UHF channels are set into the system and tabs bearing the desired channel indicia are inserted into the pushbutton switches 20 and 22. If desired, the selected VHF and UHF channels may be selectively changed at any time.

A remote control tuning device 24 is provided for use with the present tuning system and includes an off/on button 26. An up button 28 is provided to be depressed to enable sequential selection of the channel by moving the tuning system of the television set 10 from one channel to a higher number channel. A down button 30 is provided to be depressed to cause automatic sequential selection of television channels in the set 10 by causing the tuning of the set to move from one channel to a lower number channel.

As noted, any of the pushbutton switches 20 and 22 may be selectively depressed and the television set 10 will be automatically tuned to the desired channel. This type of selection is termed parallel access or selection. The type of series channel selection provided by the remote control unit 24 is termed sequential channel selection. It will be understood that an array of switch buttons could be provided on the remote control unit 24 to enable parallel selection of channels by the remote control unit 24. Remote control unit 24 operates according to any one of a variety of well known techniques, such as by generating acoustic signals which are detected by tuned circuits in the television set 10 to enable channel selection.

An up voltage programming pushbutton switch 32 and a down voltage programming pushbutton switch 34 are provided behind a removable panel, etc. on the television set 10 to enable initial tuning of the VHF and UHF channels which may be selected by actuation of the switches 20 and 22. In order to initially program the system to select a desired channel, the operator first disengages the channel skip circuit and AFC circuit (to be later described) and then pushes the first VHF switch 20 which corresponds to Channel 2. Both voltage programming switches 32 and 34 are then depressed for a brief period to clear the system. The switch 32 is then depressed until Channel 2 appears on screen 12. If either switch 32 or 34 is depressed longer than a preset period, as for example eight seconds, the system switches to a fast tuning mode. When the picture appears on screen 12, the switch 32 is released and, on again pressing switch 32 or 34, the system switches back to the slow tuning mode. Switches 32 and 34 may then be "bumped" to fine tune the program on the screen 12.

When Channel 2 is tuned, the next switch 20 is depressed and the same sequence is performed to select VHF Channel 3. When all VHF channels have been programmed, the four selected UHF channels are programmed in the same way and tabs having indicia corresponding to the selected UHF channels are added to the switches 22. If desired, less VHF and more UHF channels may be programmed into the system. Once all switches 20 and 22 have been programmed, the skip circuit is again energized, and it is necessary only to depress or otherwise actuate one of the switches 20 or 22 and the set 10 will be automatically tuned to the desired channel and the actuated switch will be illuminated.

FIG. 2 illustrates a variation of the television tuning system shown in FIG. 1, and like numerals will be utilized for like and corresponding parts previously described. In this embodiment, parallel access of television channels is not provided on the front panel of the set 10, but only serial or sequential channel access is provided for twenty channels. Twelve lamps 36 are each provided with an indicia from 2–13 in order to indicate a desired VHF television channel when illuminated. A second set of lamps 38 is provided in order to indicate eight selected UHF channels. The indicia formed on lamps 36 are fixed, while the indicia for lamps 38 may be removed and changed as desired. The particular UHF channels which may be selected and illuminated by the lamps 38 are chosen by the operator by operation of an up voltage programming button 40 and down voltage programming button 42 in the manner previously described.

An up channel advance button 44 and a down channel advance button 46 may be selectively depressed by the operator in order to cause lamps 36 and 38 to be sequentially illuminated. When the lamp corresponding to the desired channel is illuminated, the button 44 or 46 is released and the set 10 will be tuned to the desired illuminated channel. It will be understood that sequential channel access may also be provided with the system shown in FIG. 2 by a remote control unit similar to that shown in FIG. 1. In addition, if desired, parallel access may be provided by remote control units having the required number of pushbutton selection switches.

As noted, initial programming of the channels associated with lamps 36 and 38 is accomplished in the manner previously described by operation of voltage programming buttons 40 and 42. In some cases, it may be desirable to skip certain channels during sequential access. To skip a channel, the skip disable switch is opened, and the channel is selected. Both buttons 40 and 42 are then simultaneously depressed for a brief period, and the skip disable switch is then closed. Subsequent operation of the tuning system will result in the skipping of that channel, and thus the lamps 36 and 38 corresponding to skipped channels will not be illuminated. In this manner, inactive or undesired channels need not be tuned through when searching for valid channels.

FIG. 3 illustrates a third embodiment of the television channel selection system according to the invention which enables selection of VHF channels by 12 pushbutton switches 50, each of which is provided with a suitable channel indicia. Twelve lamps or light emitting diodes (LEDs) 52 are disposed adjacent switches 50 and are illuminated upon depression of the associated switches 50. To enable UHF channel selection, eight pushbutton switches 54 are provided in association with eight LEDs 56 which are illuminated when the corresponding switch is depressed. Indicia tabs are operable to be inserted into the pushbutton switches 54 to designate the particular UHF channels desired to be selected. An up voltage programming switch 58 and down voltage programming switch 60 are operable during initial programming of the set 10 to tune the channels selected by pushbutton switches 50 and 54.

FIG. 4 illustrates another embodiment of a channel select and display system according to the invention. Twelve pushbutton switches 62 may be depressed to select VHF channels. Lamps 64 are associated with the pushbutton switches 62 and have indicia thereon which are illuminated when the lamp is energized by the depression of the corresponding pushbutton switch 62. Eight, or any other selected number less than eight, pushbutton switches 66 may be depressed for selection of UHF channels. Eight lamps 68 include selected indicia thereon corresponding to the desired UHF channels. The indicia may be selectively changed by removing tabs bearing the indicia and by selection of new tabs with different indicia thereon. An up voltage programming button 70 and a down voltage programming button 72 enable tuning of the desired channels to be selected by the pushbutton switches 62 and 66. It will be noted, if desired, a remote control unit similar to that shown in FIG. 1 may be utilized to control sequential selection of the channels of the system shown in FIGS. 3 and 4. Further, up and down channel selection switches may be also incorporated on the select system shown in FIGS. 3 and 4.

Figure 5:
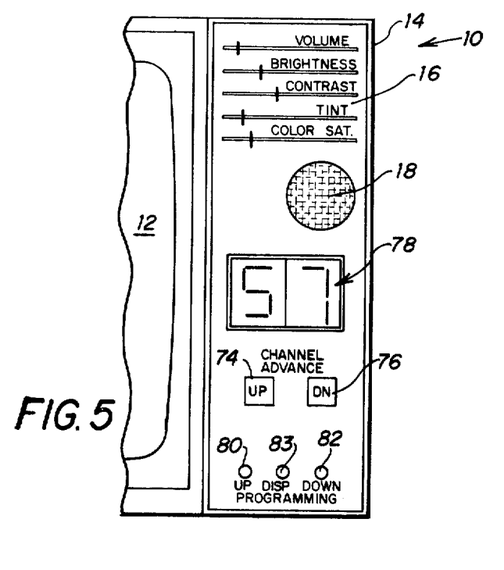
FIG. 5 illustrates a sequential access channel selection system having a two digit seven segment numeric channel display.

FIG. 5 illustrates a station select and display system wherein sequential channel selection is enabled by an up channel advance button 74 and by a down channel advance button 76. The number of the channel presently being displayed on the screen 12 is displayed in a seven segment two digit display 78. In this embodiment, the VHF channel numbers are contained in a read only memory (ROM), and are not programmable. The UHF channel numbers which may be displayed in the display 78 are chosen by operation of a display programming button 83, which is depressed until the correct number is displayed, then released. In operation, the operator pushes either the up button 74 or the down button 76 and when the desired television channel number is displayed on the display 78, the operator releases his finger and the set is tuned to the desired channel.

Figure 6:
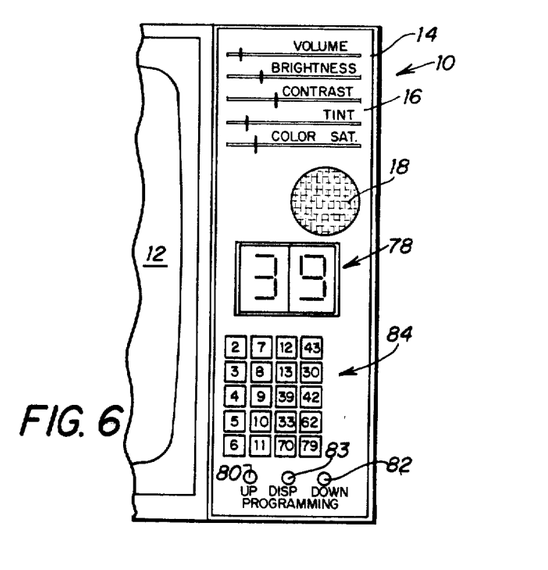
FIG. 6 illustrates a 20 channel parallel access system with a two digit seven segment channel display.

FIG. 6 illustrates a variation of the system shown in FIG. 5 wherein parallel channel access may be provided by the use of a switch array 84. The switch array 84 may comprise mechanical pushbutton switches or sense touch buttons with removable tabs to enable the channel number to be changed. In operation of the system shown in FIG. 6, the desired channel is selected by merely depressing or actuating a switch in the array 84 which corresponds to the desired channel. The desired channel number will appear in the display 78 and the set will be automatically tuned for display of the selected channel.

Sixteen Channel Tuner With Neon Display

Figure 7:
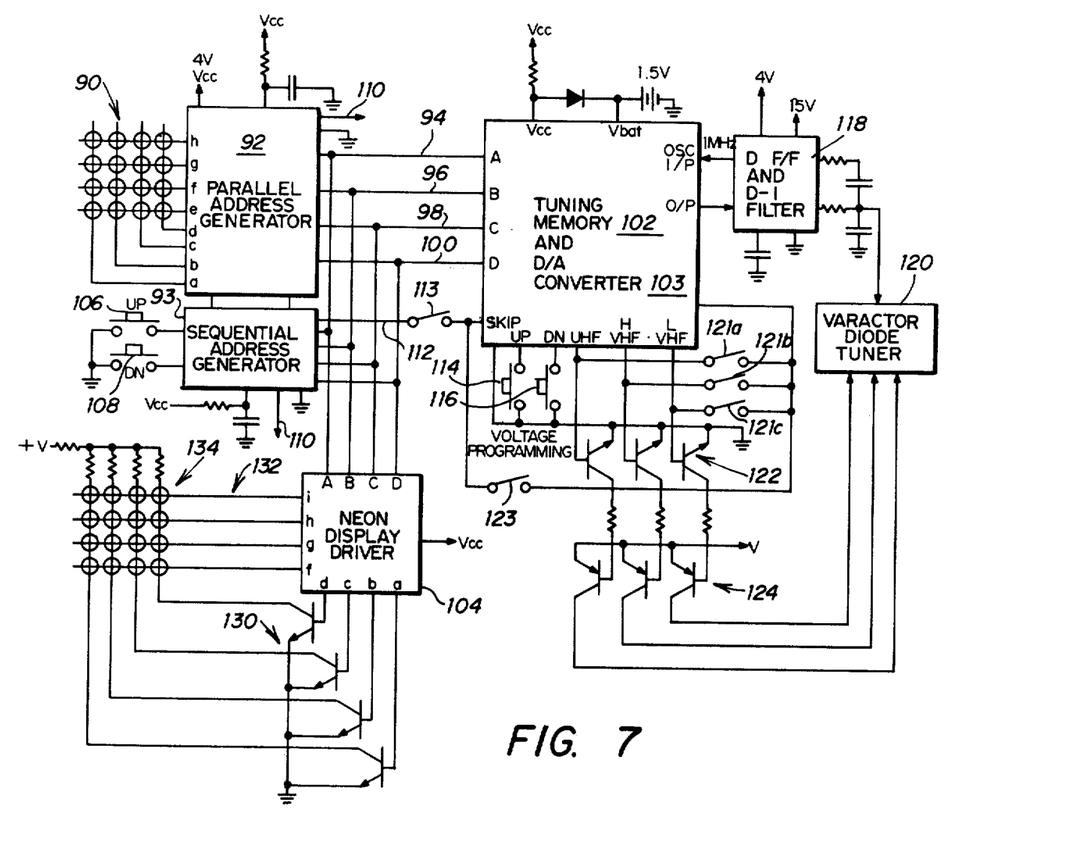
FIG. 7 is a block diagram of a 16 channel parallel or sequential access system with a neon light illuminated tab display.

FIG. 7 illustrates a sixteen channel system with a neon light display. This system may be utilized to provide the functions of the systems shown in FIGS. 1–4. The terminals of a 4×4 pushbutton switch array matrix 90 are connected to a parallel address generator 92 which applies binary address signals on a multiline bus comprising four leads 94, 96, 98 and 100 to a tuning memory 102 and to a neon display 104. A second sequential address generator 93 also connects to leads 94, 96, 98 and 100. The multiline bus enables the present system to be modular, such that different displays and address generators may be easily substituted to provide a wide range of desired functions. An up pushbutton switch 106 and a down pushbutton switch 108 are connected to the address generator 93 to enable serial channel access when desired. The address generators 92 and 93 generate an AFC (Automatic Frequency Control) defeat signal via leads 110 which is utilized to eliminate AFC during tuning operation. A skip signal is applied from the tuning memory 102 to the generator 93 via lead 112 to enable predetermined tuning positions to be skipped during sequential channel selection. Switch 113 may be thrown to disengage the skip function during the set-up procedure. Switch 113 may be mechanically interlocked with the AFC switch to eliminate AFC during skip programming.

An up pushbutton switch 114 and a down pushbutton switch 116 are utilized to program the tuning memory to enable selection of desired channels. The selected binary words stored in the tuning memory 102 are applied to a digital to analog converter 103 which generates duty cycle modulated binary signals that are fed to the analog integrator, which in turn feeds the varactor diode tuner 120. Tuner 120 operates in the known manner to vary the local oscillator of the television set in order to select the desired television channels, and the RF tanks (not shown) to reject unwanted signals. Band selection signals are applied from the tuning memory 102 to the bases of transistors 122. The collectors of transistors 122 are coupled to the bases of transistors 124 to generate band selection signals UHF, HVHF and LVHF which are applied to the varactor diode tuner 120 in order to select the varactor diode set necessary to perform the desired tuning operation. The generation of the band selection signals is accomplished automatically and no action by the operator of the set is needed, except during initial programming.

The address signals generated by the address generators 92 and 93 are also applied from the multiline bus to a neon display driver 104 which enables transistors 130 and leads 132 in order to selectively energize neon light bulbs contained within a 4×4 display matrix 134. The neon display 104 is responsive to the address generated by the generators 92 and 93 such that one of the neon lamps within matrix 134 is energized to correspond with the pushbutton depressed in the matrix 90 to indicate which television channel is presently being tuned. The lamps may be incorporated into the switches 90 (FIG. 1) or placed adjacent the switches 90 (FIG. 3).

Briefly, in operation of the system shown in FIG. 7 in the parallel access mode, one of the switches in the matrix 90 is actuated. The address generator 92 detects which of the pushbutton switches was actuated and generates a four bit binary address via leads 94–100 to the tuning memory 102. In response to the digital address, the tuning memory 102 applies a binary tuning word stored in the memory to the digital-to-analog converter 103. Converter 103 converts the binary word into a duty cycle modulated binary signal, which drives integrator 118, generating an analog voltage and applies the voltage to the varactor diode set within tuner 120 which is selected by the band selection signals. Such varactor diode tuners are known in the art and generally operate as voltage variable capacitors which vary a local oscillator and RF tank frequency to provide channel tuning. The address signals generated by the generator 92 operate through the neon display driver 104 in order to energize one of the neon lamps in the array 134 in order to indicate which channel is presently being displayed.

In the operation of the system shown in FIG. 7 in the serial or sequential channel access mode, one of the up channel select buttons 106 or down channel select buttons 108 is depressed by the operator. The address generator 93 then generates a series of addresses to the tuning memory 102 such that a series of the stored binary words in the memory 102 is applied to the digital-to-analog converter 103 and integrator 118. A series of analog voltages are then applied to the varactor diode tuner 120 such that one channel after another is selected for display. The address from the address generator 93 is also applied to the neon display driver 104 such that lamps in the array 134 are sequentially energized in order to indicate which of the channels is presently being displayed. When the operator sees that the desired channel is displayed by viewing the energized lamp in the array 134, he releases his finger from one of the buttons 106 or 108 and the set is properly tuned. As previously noted, desired channels may be programmed by operation of the up voltage programming button 114 and down voltage programming button 116 such that the channels are skipped during sequential tuning. In such a case, the tuning memory 102 operates to skip the unused position and the neon display 134 does not display the skipped channel indication.

Twenty Channel Tuner With Numeric Display

Figure 8:
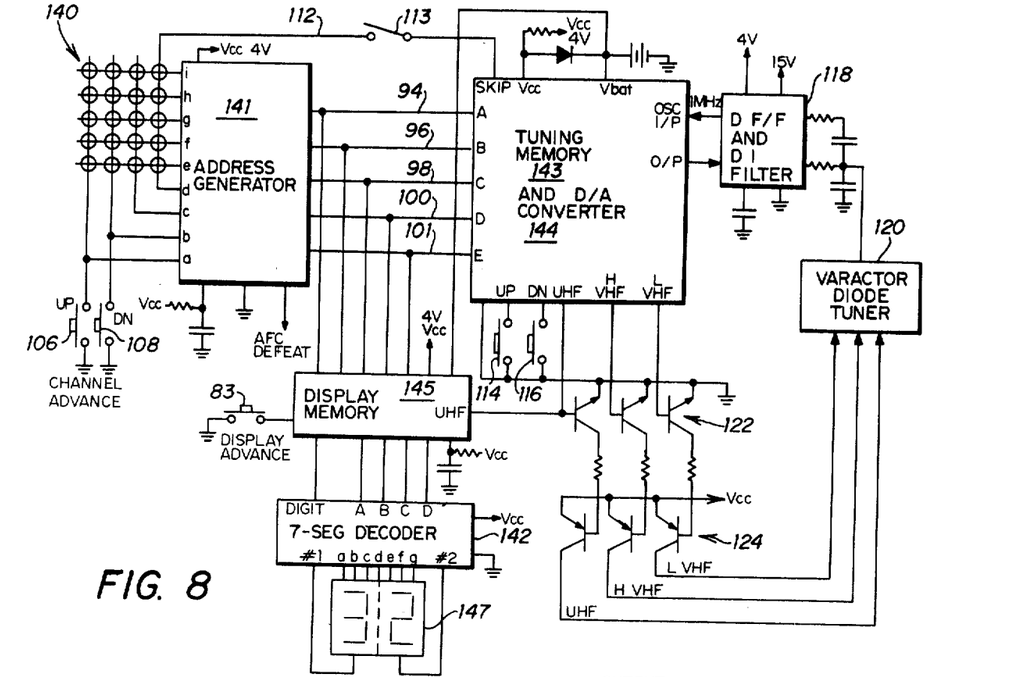
FIG. 8 is a block diagram of a 20 channel combined sequential and parallel access system with a two digit seven segment display.

FIG. 8 illustrates a system somewhat similar to the system shown in FIG. 7, and thus like numerals are utilized for like and corresponding parts previously described. In this embodiment, a 5×4 pushbutton switch selection matrix 140 is provided such that 12 VHF and 8 UHF channels may be selected. It will, of course, be understood that the display shown in FIG. 8 may be used with the system of FIG. 7, and vice versa, the illustrated systems being merely exemplary.

In the embodiment of FIG. 8, a multiline bus comprising five address lines 94, 96, 98, 100 and 101 extends between an address generator 141 and a tuning memory 143. An advantage of the system shown in FIG. 8 is that both the up channel select switch 106 and down channel select switch 108 are connected to terminals of the matrix 140, and thus do not require additional chip pin connections. Moreover, the skip signal applied via lead 112 is applied through matrix 140 to the address generator 141. The system shown in FIG. 8 may be used in a system such as shown in FIGS. 5 or 6, or alternatively may be utilized in a channel selection system utilizing both the up and down channel advance buttons 74 and 76 of FIG. 5 and the pushbutton array 84 shown in FIG. 6 on the same television set front panel.

The operation of the system shown in FIG. 8 is similar to that shown in FIG. 7, except that the five address lines from the address generator 141 are applied to a display memory 145 which generates control signals to a seven segment decoder 142. The two circuits 142 and 145 may be formed on separate chips, or may be combined in one circuit. Decoder 142 drives the two digit seven segment display 147 to provide a visual indication of the channel presently being tuned. If desired, the neon lamp display driver 104 of FIG. 7 may be used in place of the digital readout and display.

Address Generator For Sixteen Channel Sequential Access System

Figure 9:
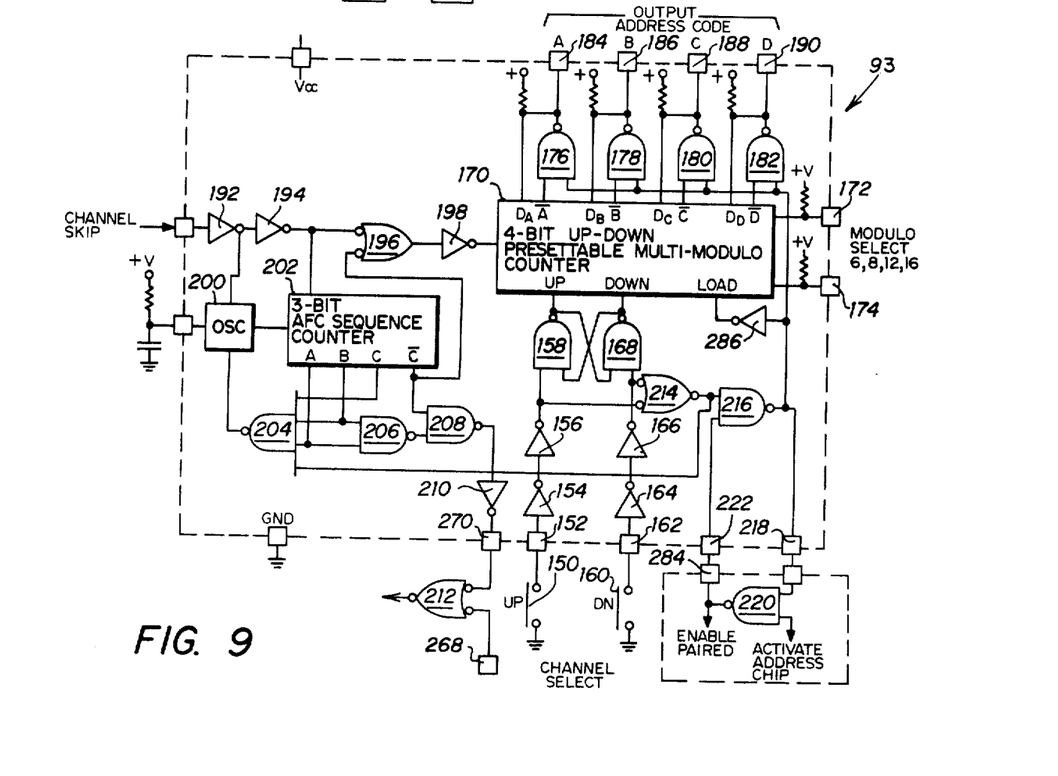
FIG. 9 is a schematic diagram of an address generator for a 16 channel sequential channel selection circuit.

FIG. 9 illustrates in schematic detail a sequential access program generator 93 for use in the system of FIG. 7. As will be subsequently described, the circuit shown in FIG. 9 may be combined with circuitry shown in FIG. 12 to allow the selection by a manufacturer of serial and/or parallel channel access. An advantage of the circuitry shown in FIG. 9 is that the entire circuit may be formed on a single 16 pin semiconductor chip utilizing conventional integrated fabrication techniques.

Referring to FIG. 9, an up channel select pushbutton switch 150 is connected to a pin 152 of the semiconductor chip and is applied through inverting buffers 154 and 156 to a terminal of a NAND gate 158. Similarly, a down channel select pushbutton switch 160 is applied to a pin 162 of the semiconductor chip and is applied through inverting buffers 164 and 166 to a terminal of a NAND gate 168. Gates 158 and 168 are interconnected as a latch. The outputs of gates 158 and 168 are applied to the up and down inputs of a four bit up/down presettable multi-modulo counter 170. Counter 170 enables the circuit to select either 6, 8, 12 or 16 television channels, as desired. In order to set the counter 170 to enable selection of a predetermined number of television channels, pins 172 and 174 are selectively grounded or opened according to a conventional code.

The outputs of the counter 170 are applied through NAND gates 176, 178, 180 and 182 to pins 184, 186, 188 and 190 to provide the four bit binary address which is applied to leads 94, 96, 98 and 100 previously shown in FIG. 7. The channel skip signal is generated from circuitry in the tuning memory 143 of FIG. 8 and is applied through inverting buffers 192 and 194 to an input of an OR gate 196. The output of gate 196 is applied through an invertor 198 to control the clocking of the counter 170 such that a memory address will be skipped for each input signal on the channel skip line.

An oscillator 200 generates clock signals to a three bit AFC sequence counter 202. The $\overline{C}$ output of counter 202 comprises a clock out signal which is applied to the second input of gate 196. The output of invertor 192 is applied as an extend signal to oscillator 200, and the output of invertor 194 is applied as a clear signal to counter 202. The three bit outputs from counter 202 are applied as inputs to a NAND gate 204, the output of which is applied as an enable signal to oscillator 200. The A and B outputs from counter 202 are applied to a NAND gate 206, the output of which is applied through a NAND gate 208 and invertor 210 to an input of an OR gate 212 to provide a stretched AFC defeat signal.

The outputs of invertors 156 and 166 are tied to the inputs of an OR gate 214, the output of which is applied to a NAND gate 216. The output of gate 216 is tied to inputs of NAND gates 176–182. The output of gate 216 is also applied to a pin 218 to a NAND gate 220 which is located on the chip to be described in FIG. 12. The output of gate 220 is applied through pin 222 to the input of gate 216. Gate 220 comprises a latch which enables the selection by a television manufacturer of either the serial access circuit shown in FIG. 9 or the parallel access circuit shown in FIG. 12, or both circuits. The output of gate 216 is also applied to the load input of counter 170.

Figure 10:
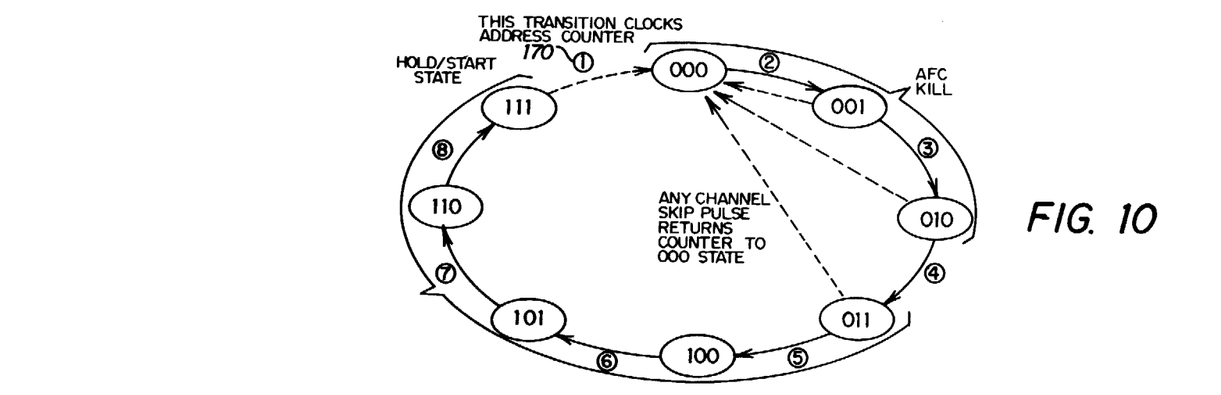
FIG. 10 is a state diagram of the operation of the AFC sequence counter and associated circuitry of the circuit shown in FIG. 9.
Figure 11:
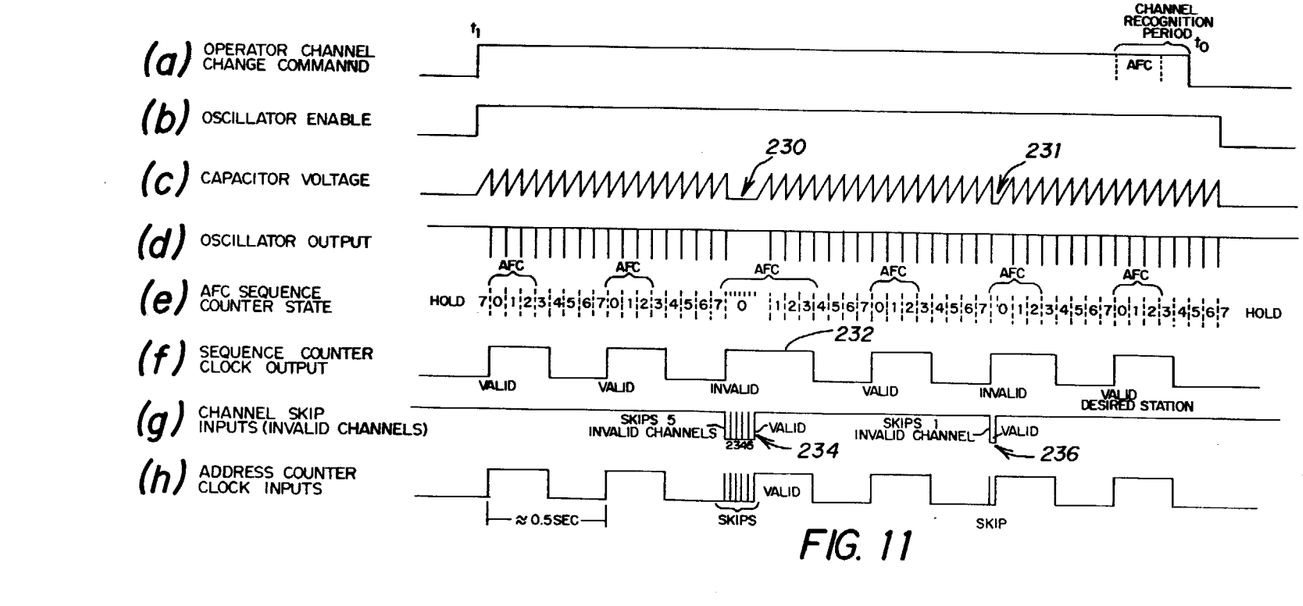
FIGS. 11a–h comprise waveforms of portions of the circuit as shown in FIG. 9 during operation.
Figure 12:
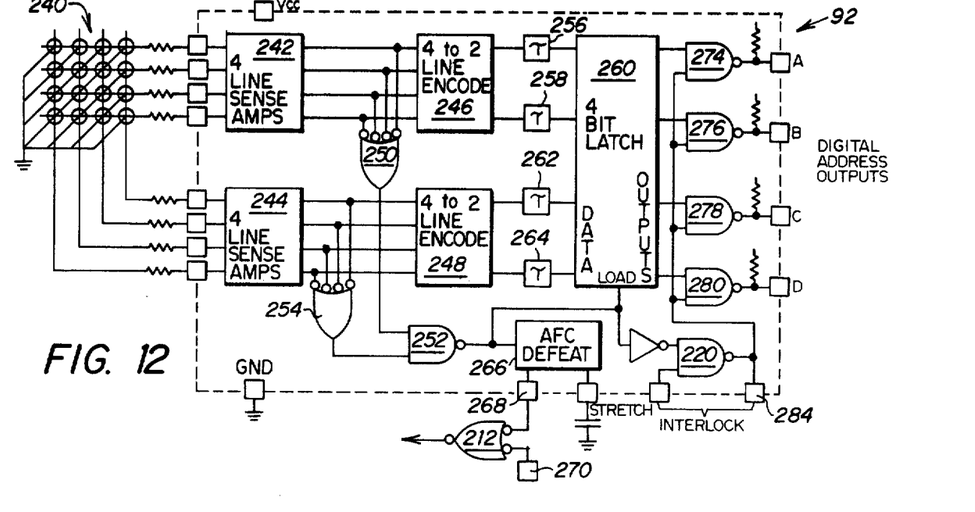
FIG. 12 is a schematic diagram of a 16 channel parallel access address generator for use in conjunction with the sequential access circuit of FIG. 9.

FIGS. 10 and 11 assist in the explanation of the operation of the system shown in FIG. 9. FIG. 10 comprises a state diagram illustrating the various stages of operation of the AFC sequence counter system of FIG. 9 during sequential channel selection. FIG. 11 illustrates various waveforms of portions of the circuit of FIG. 9. If it is desired to operate the television set only in the sequential access mode, pin 222 is grounded such that the circuit of FIG. 9 is activated and the circuit to be described in FIG. 12 is not installed. This grounding connection will be made by the television manufacturer upon determination of the type of channel selection control desired. If the manufacturer so decides, both the circuits of FIGS. 9 and 12 will be used to provide both sequential and parallel access. Upon grounding of pin 222, gate 216 generates a logic one output which allows data to ripple through the gates 176, 178, 180 and 182.

Referring to FIG. 10, at the beginning of operation of circuitry shown in FIG. 9, the counter 202 is set at 111. When the operator depresses either the up or down channel selection buttons 150 or 160, the counter 202 cycles to state 000 generating a station change signal, and then to states 001 and 010. During the counter states 000, 001 and 010, the gates 206 and 208 decode the counter outputs and generate the AFC defeat signal through gate 212. During the remaining states 011, 100, 010 and 110, the operator decides whether or not the channel being accessed is the desired channel. If so, the operator releases the button 150 or 160 and terminates operation of the system. The oscillator 200 is enabled through the NAND gate 204 during this operator recognition time and the oscillator 200 cannot be stopped during the states of operation until the operator takes his finger off the up or down selection buttons 150 or 160. The counter 202 will only stop in state 111 in any case.

If the particular station being accessed is not the desired station, the operator maintains his finger on either buttons 150 or 160, and the counter 202 sequences to state 111 and to state 000, such that a station change signal is generated to counter 170 and the cycle is repeated. The counter 170 then generates a new binary address to pins 184–190. If, however, a skip signal is generated during any state, the skip signal is applied from gate 196 and invertor 198 to counter 170 such that the counter is advances one state for each skip signal. The memory address, or addresses, are then skipped and the cycle begins again for another cycle. The resulting outputs from the counter 170 for a valid station comprise a unique four bit binary word which is decoded by subsequent circuitry.

Specifically referring to sequence counter 202 and associated circuitry in FIG. 9, a logic low appearing at the output of gate 214 and which is applied to an input of NAND gate 204 forces the output of a NAND gate 204 high, thereby enabling the oscillator 200. The counter 202 will continue to count in complete cycles as long as a logic low forces a one on the enable output of gate 204. When the low applied to gate 204 is removed, the output of gate 204 will set up conditions for the counter 202 to stop the next time that logic state 111 appears at the output of counter 202, thereby terminating the cycle.

Referring to FIG. 11, waveform 11a illustrates the depression of the up channel select button 150 by the operator during the time interval $t_1-t_0$. The waveform shown in FIG. 11b illustrates the oscillator enable signal that is applied to oscillator 200 from gate 204. The waveform shown in FIG. 11c illustrates the capacitor charging voltage generated within the oscillator 200. The interval designated generally by arrow 230 indicates the generation of skip channel pulses while that shown as 231 illustrates one skip pulse. The waveform shown in FIG. 11d indicates the output of the oscillator 200 which is applied to clock the sequence counter 202. The waveform shown in FIG. 11e comprises the eight states of operation of the counter 202 previously described in FIG. 10. The first three states zero, one and two of each cycle provide the AFC defeat function.

The waveform shown in FIG. 11f comprises the clock output of the counter 202 which is applied to gate 196 and to the invertor 208. The clock output pulse 232 is elongated due to the generation of skip channel signals.

The waveform shown in FIG. 11g comprises the channel skip inputs which are applied through inverters 192 and 194 to gate 196. As noted, the channel skip inputs are generated by circuitry to be subsequently described such that invalid channels which do not have programs in a particular area will not be cycled through by the present circuit. During the interval designated generally by the arrow 234, five skip signals are generated such that five invalid channels are skipped. During the interval designated generally by the numeral 236, a single invalid channel is skipped. The waveform shown in FIG. 11h comprises the clock inputs which are generated by gate 196 and are inverted by inverter 198 to clock the counter 170.

During operation of the circuit of FIG. 9, the depression of up channel select button 150 causes the counter 170 to generate an upward changing sequence of four bit address words to pins 184, 186, 188 and 190. These address words are applied to the memory circuit 143 of FIG. 8 in order to select memory words, which in turn cause the control of varactor diode tuners. Depression of the down channel select button 160 causes operation of the counter 170 in the down mode to cause a downward sequence of address words to be generated from the counter 170. As noted, the number of address words generated by the counter 170 is controlled by selective grounding of pins 172 and 174.

Address Generator For Sixteen Channel Parallel Access System

FIG. 12 illustrates a parallel access address generator 92 which may be fabricated on a single 18 pin semiconductor chip with integrated logic techniques and utilized in the system of FIG. 7. This circuit may be used in place of or in conjunction with the circuitry shown in FIG. 9. As previously noted, the circuits shown in FIG. 9 and FIG. 12 are interconnected by a common gate 220, the terminals of which may be selectively grounded to enable the television manufacturer to use either the circuitry shown in FIG. 9 or FIG. 12. If the gate terminals are cross connected, both circuits are enabled for use.

Referring to FIG. 12, a 4×4 array of sixteen touch sense switches, or any other suitable type of switches, is formed as a switch matrix 240. Four terminals of the matrix 240 are connected to a four line sense amplifying stage 242, while the remaining four terminals of the matrix 240 are connected to four line sense amplifiers 244. The outputs of amplifiers 242 are applied to a four to two line encode circuit 246. The outputs of the amplifiers 244 are applied to a four to two line encode circuit 248. The outputs of the amplifiers 242 are also applied to a NOR gate 250, the output of which is applied to a NAND gate 252. The outputs from the amplifiers 244 are applied to the inputs of a NOR gate 254, the output of which is also applied to an input of gate 252.

The two outputs from the encode circuits 246 are applied through time delays 256 and 258 to a four bit latch 260. The outputs from the encode circuit 248 are applied through time delays 262 and 264 to the latch 260. The output of gate 252 is applied to load the latch 260 and is applied to the AFC defeat circuit 266. The AFC defeat circuit 266 generates an AFC defeat signal which is applied through the gate 212 previously shown in FIG. 9. Pin 268 connects the gate 212 to the chip shown in FIG. 12, while pin 270 connects the gate to the circuit of FIG. 9. The outputs of the latch 260 are applied through NAND gates 274, 276, 278 and 280 to provide a four bit binary address at pins A, B, C and D.

In operation of the circuit shown in FIG. 12, the manufacturer may choose either or both of the address generator circuits shown in FIG. 9 and FIG. 12 by selective grounding or interconnecting of terminals of the gates 220. In some instances, the circuit shown in FIG. 9 will be utilized as the remote control channel selection circuitry, while the circuitry shown in FIG. 12 will be used as the channel selection circuitry for the set control panel. When one of the sense switches in the matrix 240 is depressed, a logic zero appears at the output of one of the amplifiers 242 and one of the amplifiers 244. Gates 250 and 254 then generate logic one outputs which operate through the gate 252 in order to initiate an AFC defeat signal from circuit 266. This eliminates the AFC of the system during the tuning operation, and also provides an extended AFC defeat signal after the customer releases the button.

The encode circuits 246 and 248 detect the output from the amplifiers 242 and 244 and transmit encoded signals through the time delays 256–264 which provide sufficient time delays to enable the latch 260 to be loaded in response to the signals generated by the gate 252. A four bit binary code is generated from the encode circuits 246 and 248 for storage in the latch 260. The latch 260 then generates a four bit digital code output through the NAND gates 274–280. The outputs from the gates 274–280 may not be transmitted to pins A–D unless the gate 220 generates a logic one which is applied to the inputs of the NAND gates 274–280. Gate 220 also operates to override the output from the circuit shown in FIG. 9.

When the circuits shown in FIGS. 9 and 12 are used concurrently, provision must be made to store the state of the circuit shown in FIG. 12 in the parallel circuit of FIG. 9. Consequently, assume that the circuit shown in FIG. 9 has been placed in the up mode and then the circuit shown in FIG. 12 is energized and a channel selected thereby. When the operator next tries to go back to the circuit shown in FIG. 9, it is desirable to start at the last channel selected by the circuitry shown in FIG. 12. Thus, the data word generated from the four bit latch 260 is also applied to the output of the circuit shown in FIG. 9. Thus, when the circuit of FIG. 9 is not active, a load signal is generated from the gate 220 and is applied through the invertor 286 to load the counter 170 with the output of the circuit shown in FIG. 12.

Figure 13:
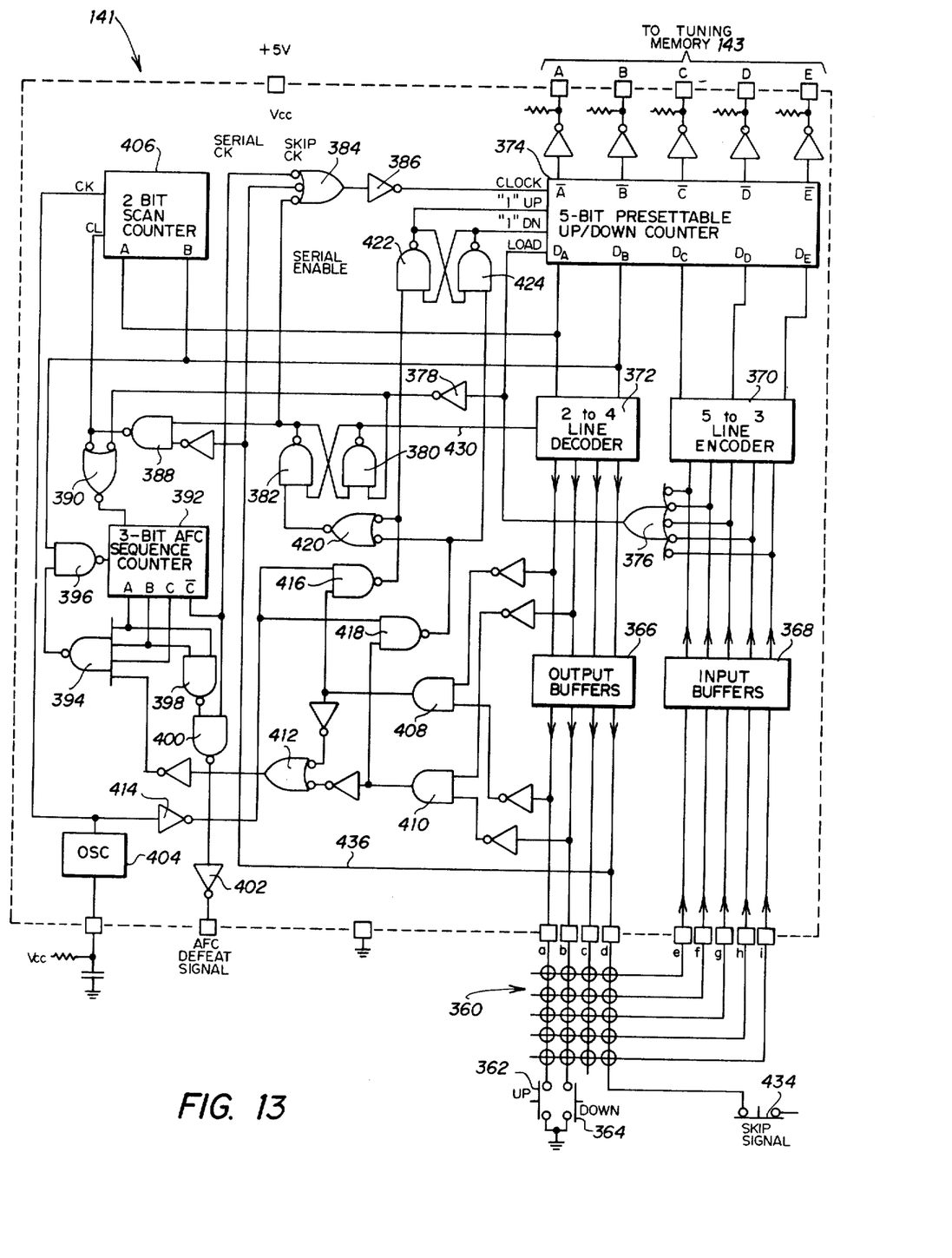
FIG. 13 is a schematic diagram of a 20 channel combined sequential access and parallel access address generator as shown in FIG. 8.

Combined Serial and Parallel Access Channel Selection Circuit for Twenty Channel Tuning System FIG. 13 is a schematic diagram of the address generator 141 for use in the 20 channel tuning system shown in FIG. 8. An advantage of the circuitry shown in FIG. 13 is that both serial access and parallel access channel selection functions are accomplished by circuitry on a single semiconductor 18 pin integrated logic semiconductor chip.

Referring to the circuit shown in FIG. 13, a 4×5 20 pushbutton switch array 360 is provided which may correspond to the parallel access systems shown in FIGS. 1, 4 and 6. An up sequential access button 362 and a down sequential access button 364 are connected through the matrix 360 to enable sequential channel selection. Such up and down channel selection may alternatively be accomplished with use of a remote control unit. The channel skip signal from the memory chip also enters chip 141 through the switch matrix 360.

The terminals of the array 360 are connected to a set of output buffers 366 and input buffers 368. The outputs from the input buffers 368 are applied to a five to three line encoder 370. The inputs of the output buffers 366 are connected to a two to four line decoder 372. The outputs of encoder 370 are applied to the Data C, D and E terminals of a five bit presettable up/down counter 374. The decoder 372 inputs are connected to $D_A$ and $D_B$ input terminals of the counter 374. The output of the counter 374 is applied to pins A–E and comprises the five bit output applied from the address generator 141 to the tuning memory 143 as shown in FIG. 8.

The outputs from the input buffers 368 are also applied to the inputs of an OR gate 376, the output of which is applied to load counter 374 and is applied through an invertor 378 to an input of a NAND gate 380. Gate 380 is connected in a latch configuration with a NAND gate 382. The output of NAND gate 382 is applied as an input to an OR gate 384, the output of which is applied through an invertor 386 to clock the counter 374. The output of gate 382 is also applied as an input to a NAND gate 388, the output of which is applied to an OR gate 390 which applies a clear signal to a three bit AFC sequence counter 392.

The A, B and C outputs of counter 392 are applied to a NAND gate 394, the output of which is applied as a clock through NAND gate 396 to counter 392. The $\overline{C}$ output of counter 392 is applied as a serial clock to the OR gate 384. The A and B outputs of counter 392 are applied through a NAND gate 398 and a NAND gate 400 and through an inverting buffer 402 to cause the generation of an AFC defeat signal.

An oscillator 404 generates clock signals which are applied to the clock input of a two bit scan counter 406. The NAND gate 388 generates a clear signal which is applied through gate 390 to the counter 392, and to the scan counter 406. The A and B outputs of counter 406 are applied to the decoder 372. The B output of counter 406 is applied as an input to gate 396, serving as the clock for counter 392.

Inputs and outputs of the output buffers 366 are applied through inverters as inputs to AND gates 408 and 410, the outputs of which are applied through inverters to an OR gate 412. The output of OR gate 412 is applied through an inverter to an input of gate 394. The output of oscillator 404 is applied through an inverter 414 to the inputs of NAND gates 416 and 418. The output of gate 416 is applied to an input of an OR gate 420 and to the input of a NAND gate 422. The output of gate 418 is applied to the second input of gate 420 and is applied to an input of a NAND gate 424. Gates 422 and 424 are interconnected in a latch configuration in order to provide up and down control signals to the counter 374.

In operation of the circuitry shown in FIG. 13, both sequential and parallel access channel selection may be accomplished. The local oscillator 404 drives the two bit scan counter 406 which is conventionally running. The two binary outputs from the counter 406 are applied to $D_A$ and $D_B$ terminals of the up/down counter 374 which are the parallel load data inputs of the counter 374. The outputs of the counter 406 are also applied to the two to four line decoder 372 which converts from the binary code to a single one out of four code. The outputs from the decoder 372 are applied to the output buffers 366.

The outputs of buffers 366 are high 25 percent of the time and are low 75 percent of the time. Thus, the four vertical lines of the pushbutton matrix array 360 are sequentially high when the system is in the parallel access mode. If the operator pushes one of the twenty buttons in the array 360, and one of the vertical lines is high, the corresponding horizontal line also goes high, which condition is applied through the input buffer 368 and through the five to three line encoder 370. The encoder 370 converts the signal into a binary code which corresponds to the three most significant bits of the address code and which is applied to the parallel load data inputs of the up/down counter 374. The gate 376 performs a NOR function on the zeroes on the inputs of the encoder 370 such that any input to the encoder 370 which goes low results in the corresponding three bit binary code being loaded into the counter 374. Additionally, at the same time, the two bit code applied at $D_A$ and $D_B$ is loaded into counter 374.

As long as the operator's finger remains on one of the pushbuttons in the array 360, a signal is generated through gates 376, 378 and 390 to clear the counter 392. Counter 392 and its associated circuitry thus operates in a similar manner as counter 202 in the circuit shown in FIG. 9. When the system is in the parallel mode, a logic one appears on line 430, and a zero thus appears at the output of gate 382. No clock signals are applied through gate 384 and inverter 386 to the up/down counter 374. The operation of the circuitry shown in FIG. 13 is thus similar to the operation of the circuitry shown in FIG. 9.

If it is desired to operate the system of FIG. 13 in the serial access mode, one of the buttons 362 or 364 is depressed in order to ground the respective vertical line through the array 360. Gate 408 or 410 detects the up/down mode by detecting the situation wherein the output buffer 366 commands the line B to go high, but when the down button 364 is depressed it cannot comply, thereby creating the down command. Similarly, gate 408 detects the up mode which occurs when the output buffer 366 commands the A line to go high, but the up button 362 is depressed, thereby grounding the line. The outputs of gates 408 and 410 are applied to gates 416 and 418 and Nanding with the narrow output pulse from the invertor 414 and the oscillator 404. The outputs of the gates 416 and 418 are applied to gate 420 which detects a logic zero on either of the gates in order to set the serial side of the latch comprising gates 380 and 382. Setting of the serial side of the latch enables clock signals to be applied through the gate 384 to the up/down counter 374 for operation of the circuit.

Other outputs of gates 408 are inverted and applied to gate 412 which detects a logic zero on either input. Detection of the logic zero by gate 412 causes the generation of the logic one which is inverted and utilized to momentarily depress, through gate 394, the application of clock signals to the counter 392. Unless counter 392 is cleared, the counter will attempt to start the AFC sequence. This operation just described is provided by the first pulse generated through the array 360 by operation of the up or down buttons 362 and 364.

In the serial mode, a latch comprising gates 380 and 382 applies a logic zero to line 430 in order to indicate to the decoder 372 that it is desired that all logic ones appear on the outputs A–D from the output buffers 366.

The latch comprising gates 380 and 382 enables application of clock pulses to counter 374 in the manner previously described. In addition, the latch opens gate 388, thereby enabling counter 392 and counter 406 to be cleared when receiving skip data. When no skip clock is available, gate 384 is opened in order to advance the counter 374 one count. Counter 374 thus operates to generate the five bit binary code on pins A–E.

If the channel selected by the operator is not a valid channel and it is desired to be skipped, a skip signal is applied through switch 434. The skip signal is large enough to overpower the circuitry shown in FIG. 14 in the same manner as the switches 362 and 364, such that the skip data flows back through line D of matrix 360 and line 436 to the OR gate 384. Gate 388 detects the skip signal and generates a logic zero, thereby reconstituting the skip signal in the serial mode. The logic zero from gate 388 clears the counter 392 and maintains the counter 406 in zero-zero state, preventing normal counting action. The latch comprising gates 380 and 382 has previously opened the gate 384 for operation in the serial channel selection or to receive the skip signals via lines 436.

When either the up button 362 or down button 364 is depressed, the counter 374 must be directed as to which direction to count. The output from either gate 416 or 418 sets one side of the latch comprising gates 422 and 424 in order to set the counter 374 in the desired count mode.

Figure 14:
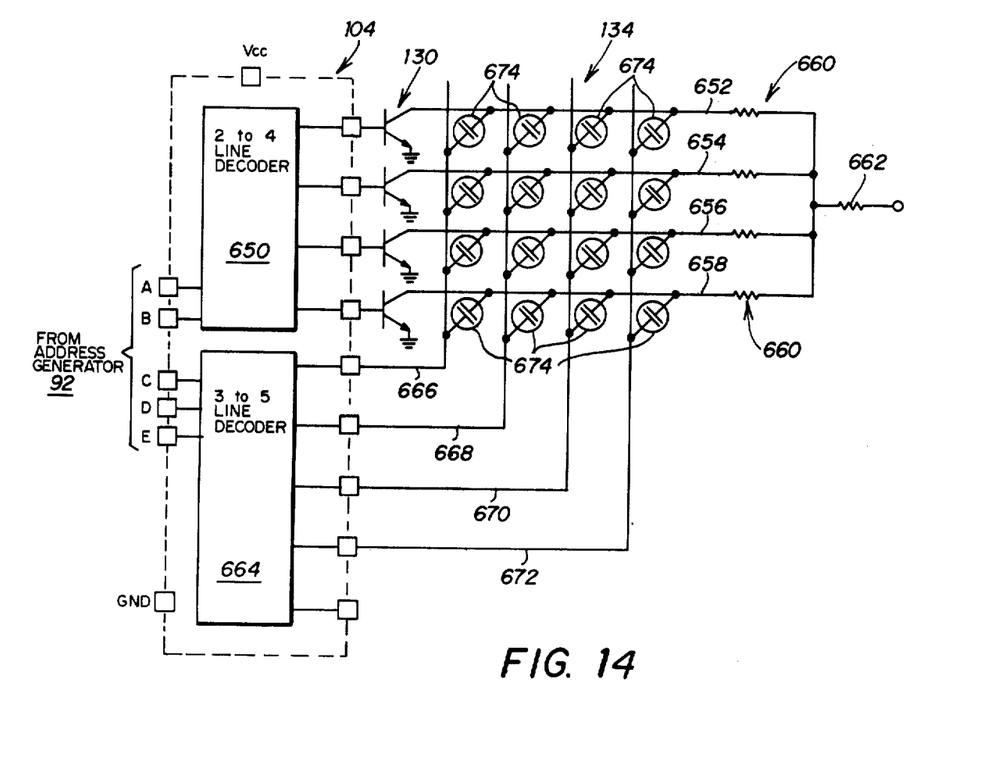
FIG. 14 is a schematic diagram of the decoder and driver for the 16 channel select circuit shown in FIG. 7.

If the mode of operation of the circuit shown in FIG. 14 is changed from the serial access to the parallel access on a valid channel, no data is provided to reset counter 392. Counter 406 is scanning at this time, but is blocked by the decoder 372, and the action of line 430 from gate 380. When the operator presses one of the buttons in the array 360, the line is already high and is applied through the input buffers 368 to gate 376 in order to set the latch comprising gates 380 and 382 back to the parallel mode.

As noted, the selected vertical line in the array 360 is high 25 percent of the time and is low 75 percent of the time. The decoder 372 is now open to decode the input data from the scan counter and to cause loading of the counter 374 with the correct data.

When the system shown in FIG. 14 is in the parallel access mode and the operator attempts to pick up an unprogrammed channel, the skip signal is applied to gate 384, which is not open and which prevents serial advance away from that channel. However, the system still performs the loading of data and gate 376 is energized such that the counter is loaded by a generated spike from gate 376. Thus, if the operator so desires, a channel that is not programmed may nevertheless be addressed.

Neon Display For Sixteen Channel Tuning System

FIG. 14 illustrates in schematic detail the neon display control circuit 104 and the neon display matrix 134 previously shown in FIG. 7. It will be understood that the neon display may be utilized for tuning systems involving greater or less than 16 channel capacity. The four bit address code from the address generator 92 is applied to inputs A–D. The inputs A and B are applied to a two to four line decoder 650, the outputs of which are applied to the bases of the four transistors 130 previously shown in FIG. 7. The collectors of the transistors 130 are tied to four horizontal lines 652–658. Load resistances 660 are tied to each of the leads 652–658. Resistances 660 are then tied to a load resistance 662 which receives a source of high voltage such as 200 volts.

The address bits C and D from the address generator 92 are applied to a three to five line decoder 664, which can be used as a two to four line decoder, the output of which is applied to four leads 666, 668, 670 and 672 which intersect with the leads 652–658 to form a matrix array. Sixteen neon light bulbs 674 are interconnected across the leads in the manner illustrated. As previously noted, the address applied to pins A–D of the circuitry shown in FIG. 8 causes illumination of the selected one of the neon light bulbs 674 which corresponds to the channel selected by depression of one of the pushbutton switches in a matrix array 90. It will be understood that a similar neon display may be utilized for the 20 channel system discussed, by changing the decoder 664 to a three to five line decoder and by adding four additional neon light bulbs. Again, an advantage of the circuitry shown in FIG. 18 is the fact that the circuitry may be included in a single semiconductor fourteen pin chip manufactured according to integrated logic techniques. Input E and output line 673 may be utilized when a 20 address system is desired.

Two Digit Seven Segment Twenty Channel Display

Figure 15:
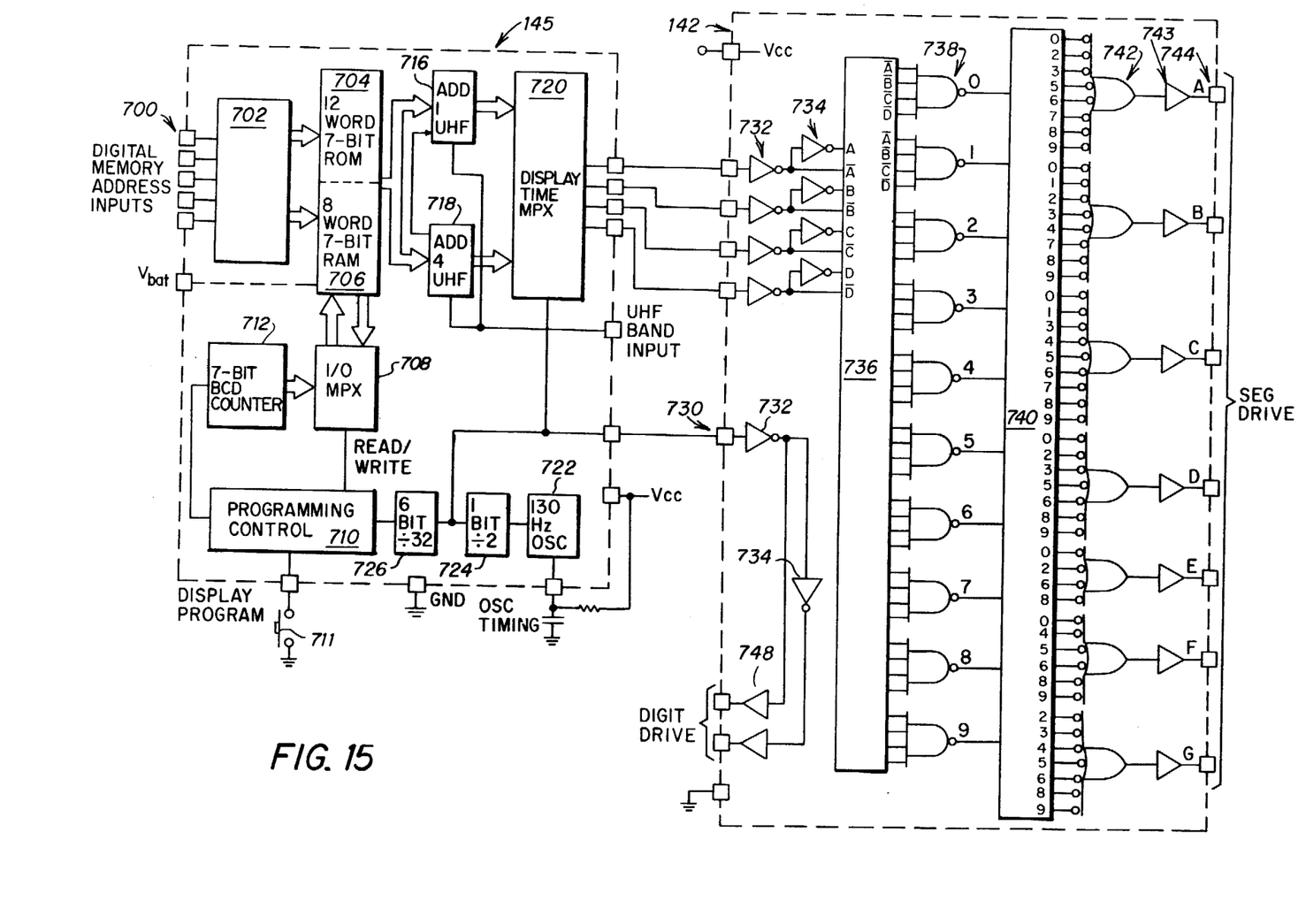
FIG. 15 is a schematic diagram of the display memory and seven segment decoder of the 20 channel select circuit shown in FIG. 8.

Referring to FIG. 15, the display memory 145 previously shown in FIG. 8 comprises five pins 700 for receiving the five digit binary memory address inputs from the address generator shown in FIG. 14. The address inputs are applied to a 5 to 20 line address decoder 702 which decodes the inputs and applies 12 decode addresses to a 12 word, seven bit read only memory (ROM) 704. ROM 704 stores the constant VHF channel code signals and thus does not require write capability. The decoder 702 also applies eight words to an eight word seven bit random access memory (RAM) 706. The RAM 706 is required to store eight different words representative of different UHF channel numbers, and thus requires read and write capability. The read and write capability is provided by an input and output multiplexer 708 which is controlled to read or write by a programming control 710. The programming control 710 generates a 2 Hz clock to a seven bit BCD counter 712 which drives the multiplexer 708. Control 710 is responsive to operation of the channel number advance button 711 to cause the words stored in RAM 706 to be selectively advanced to the desired number to provide the desired UHF channel display.

The seven bit outputs from the ROM 704 or the RAM 706 are applied through an add one UHF circuit 716 and an add four UHF circuit 718 which generates signals to a display time multiplexer 720. Clock signals for the circuitry are generated by 130 Hz oscillator 722 which applies clock signals to a divide-by-two circuit 724 and a divide-by-32 circuit 726. The output of the divide-by-two circuit 724 is applied as a digit select output signal to pin 730 of a seven segment decoder chip 142 previously shown in FIG. 8. The outputs from the display time multiplexer 720 are applied through invertors 732 and 734 to the inputs of a decoding matrix 736, which applies signals $\overline{A}$–$\overline{D}$ to selected inputs of 10 NAND gates 738.

The outputs of the gates 738 represent 10 digits and are applied through a connection matrix 740 such that selected groups of the digit signals are applied to inputs of seven NAND gates 742. The outputs of gates 742 are applied through drivers 743 to pins 744 to provide seven segment drive signals for driving the seven segment display 144 shown in FIG. 8. The digit select output signals applied to pin 730 are inverted and are applied through driver 748 in order to generate a digit drive signal to select which of the two digit displays are to be actuated. Generally, a saturated open collector NPN transistor will be connected to the outputs of the drivers 743. Large lateral PNP saturated transistors are connected to the output of the driver 748 in order to properly drive the display 144.

In operation of the circuit shown in FIG. 15, the binary memory address inputs are applied to pin 700 and select one of the 20 words stored in either the ROM 704 or the RAM 706. In order to program RAM 706, the channel number advance button 711 is depressed. Read and write control signals are thus generated from the programming control 710. The seven bit BCD counter 712 steps through the positions 00 ... 79 for the multiplexer 708 to enter into the RAM 706 as data.

As the RAM 706 must store UHF channel numbers over 80, ordinarily an eight bit RAM would be required. However, in this instance, it is recognized that the UHF channel will be greater in number than number 14. Thus, only 0 to 70 words are stored in the RAM 706 and 14 is added to the stored word by the add one and add four circuits 716 and 718. Hence, only a seven bit RAM is required. The time multiplexer 720 applies the four bit BCD numbers in units of tens to the decoding circuitry which converts the data into seven segment formats. The data is then stepped up to drive the LED display 144.

It will thus be seen that the present invention provides an improved solid state television tuning system. The present system is modular, thus enabling easy interchange of displays or channel selection switches without modification of the remainder of the circuitry. The present system does not require expensive potentiometers or bulky printed circuit board fabrication.

Tuning memory systems suitable for use in the above described selector systems are disclosed in copending application Ser. No. 509,190 filed Sept. 25, 1974 and assigned to the same assignee as the present application.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A television channel-number display circuit having reduced bit storage requirements comprising:
   means for generating address signals representative of a selected television channel,
   storage means containing a plurality of digital UHF channel-number display words and responsive to said address signals for outputting selected ones of said UHF channel-number words,
   means for adding a predetermined digital quantity to said UHF channel-number display words output from said storage means, and
   a display responsive to said UHF channel-number display words and said predetermined quantity for displaying the number of the selected UHF channel.

2. The television channel-number display circuit of claim 1 wherein said storage means comprises a seven bit word random access memory.

3. The television channel-number display circuit of claim 2 wherein said predetermined quantity comprises fourteen.

4. A television channel tuning and display system comprising:
   means for generating electrical binary address signals representative of a selected television channel,
   means responsive to said addressed signals for tuning to a selected television channel,
   a read only memory for storing a plurality of seven bit display words, each representative of a different VHF channel,
   a random access memory for storing a plurality of seven bit UHF display words each representative of a different UHF channel,
   means for addressing said read only and said random access memories with said address signal to output selected ones of said VHF and UHF display words,
   means for adding a predetermined number to said UHF display words, and
   means responsive to said VHF display words and UHF display words and said predetermined number for displaying a numerical indication of the selected television channel.

5. The tuning and display system of claim 4, wherein said means for displaying comprises a display of two digits of seven segments each.

6. The tuning and display system of claim 4 wherein said binary address signals comprise five bit binary address words.

7. The tuning and display system of claim 4 wherein said predetermined number comprises 14.

8. The tuning and display system of claim 4 and further comprising:
   means for varying the UHF display words stored in said random access memory.

* * * * *